United States Patent
Schmidt et al.

(10) Patent No.: US 11,879,060 B2
(45) Date of Patent: Jan. 23, 2024

(54) CURABLE SILICONE COMPOSITION, CURED PRODUCT THEREOF, AND OPTICAL SEMICONDUCTOR DEVICE

(71) Applicants: DOW TORAY CO., LTD., Tokyo (JP); DOW SILICONES CORPORATION, Midland, MI (US)

(72) Inventors: Randall G. Schmidt, Midland, MI (US); Kasumi Takeuchi, Ichihara (JP)

(73) Assignees: DOW TORAY CO., LTD., Tokyo (JP); DOW SILICONES CORPORATION, Midland, MI (US)

(*) Notice: Subject to any disclaimer, the term of this patent is extended or adjusted under 35 U.S.C. 154(b) by 846 days.

(21) Appl. No.: 16/966,501

(22) PCT Filed: Feb. 6, 2019

(86) PCT No.: PCT/US2019/016804
§ 371 (c)(1),
(2) Date: Jul. 31, 2020

(87) PCT Pub. No.: WO2019/157027
PCT Pub. Date: Aug. 15, 2019

(65) Prior Publication Data
US 2021/0079222 A1    Mar. 18, 2021

Related U.S. Application Data

(60) Provisional application No. 62/627,368, filed on Feb. 7, 2018.

(51) Int. Cl.
*C08L 83/04* (2006.01)
*C08G 77/12* (2006.01)
(Continued)

(52) U.S. Cl.
CPC .............. *C08L 83/04* (2013.01); *C08G 77/12* (2013.01); *C08G 77/20* (2013.01); *C08G 77/70* (2013.01);
(Continued)

(58) Field of Classification Search
CPC ......... C08L 83/04; C08G 77/12; C08G 77/20; C08G 77/70; C08G 77/80
See application file for complete search history.

(56) References Cited

U.S. PATENT DOCUMENTS

2005/0006794 A1   1/2005   Kashiwagi et al.
2006/0073347 A1   4/2006   Morita et al.
(Continued)

FOREIGN PATENT DOCUMENTS

CN   104968711 A   10/2015
JP   2006213789 A   8/2006
(Continued)

OTHER PUBLICATIONS

International Search Report for PCT/US2019/016804 dated Sep. 14, 2020, 8 pages.
(Continued)

*Primary Examiner* — Erik Kielin
(74) *Attorney, Agent, or Firm* — WARNER NORCROSS + JUDD LLP

(57) ABSTRACT

A curable silicone composition is disclosed. The curable silicone composition comprises: (A) a linear organopolysiloxane having at least two alkenyl groups and at least one aryl group in a molecule; (B) a branched organopolysiloxane represented by the average unit formula; (C) an organosiloxane having at least two silicon atom-bonded hydrogen atoms in a molecule; and (D) a hydrosilylation reaction catalyst. The curable silicone composition forms a cured
(Continued)

product having good mechanical properties and good retention of transparency under conditions of high temperature.

7 Claims, 1 Drawing Sheet

(51) Int. Cl.
*C08G 77/20* (2006.01)
*C08G 77/00* (2006.01)
*H01L 33/56* (2010.01)

(52) U.S. Cl.
CPC .............. *C08G 77/80* (2013.01); *H01L 33/56* (2013.01); *C08L 2205/025* (2013.01); *C08L 2205/035* (2013.01)

(56) References Cited

U.S. PATENT DOCUMENTS

| 2007/0112147 A1 | 5/2007 | Morita et al. |
| 2007/0166470 A1 | 7/2007 | Kashiwagi |
| 2008/0015326 A1 | 1/2008 | Kodama et al. |
| 2011/0097579 A1 | 4/2011 | Mizuno et al. |
| 2014/0024796 A1 | 1/2014 | Mizunashi et al. |
| 2015/0329681 A1 | 11/2015 | Suto et al. |
| 2015/0344692 A1* | 12/2015 | Nishijima .............. C08G 77/14 525/478 |
| 2016/0060462 A1 | 3/2016 | Kitazawa et al. |

FOREIGN PATENT DOCUMENTS

| JP | 2010013503 A | 1/2010 |
| JP | 2014019798 A | 2/2014 |
| KR | 1020150077453 A | 7/2015 |
| KR | 1020160012137 A | 2/2016 |
| WO | 2014104389 A2 | 7/2014 |

OTHER PUBLICATIONS

Machine assisted English translation of JP2006213789A obtained from https://patents.google.com/patent on Dec. 12, 2022, 9 pages.
Machine assisted English translation of JP2010013503A obtained from https://patents.google.com/patent on Dec. 12, 2022, 9 pages.

* cited by examiner

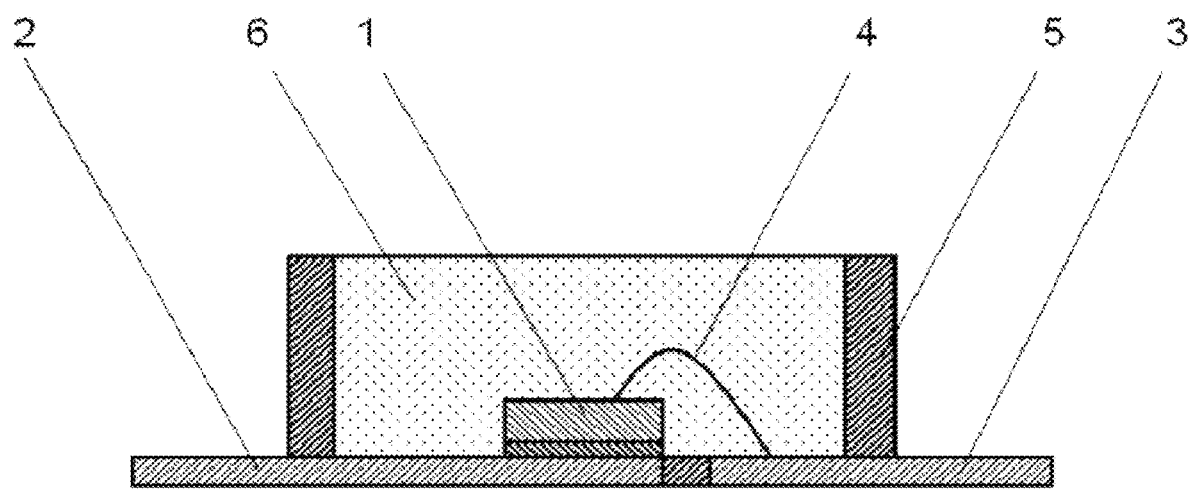

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Appl. No. PCT/JP2019/016804 filed on 6 Feb. 2019, which claims priority to and all advantages of U.S. Provisional Patent Appl. No. 62/627,368 filed on 7 Feb. 2018, the content of which is hereby incorporated by reference.

TECHNICAL FIELD

The present invention relates to a curable silicone composition, a cured product obtained by curing this composition, and an optical semiconductor device obtained by using this composition.

BACKGROUND ART

Curable organopolysiloxane compositions that can be cured by a hydrosilylation reaction are used as protective coating agents for semiconductor elements in photo couplers, light-emitting diodes (LEDs), solid-state image sensors, and other optical semiconductor devices. The protective coating agents of such semiconductor elements are required to have a high refractive index and optical transmissivity.

Curable organopolysiloxane compositions that are cured by a hydrosilylation reaction to form cured products with a high refractive index and optical transmissivity can be exemplified by the following: a curable organopolysiloxane composition comprising: a linear organopolysiloxane having at least two alkenyl groups in a molecule, a branched organopolysiloxane comprising $SiO_{4/2}$ units, $(CH_3)_3SiO_{1/2}$ units, and $(CH_2=CH)_3SiO_{1/2}$ units, an organopolysiloxane having at least two silicon atom-bonded hydrogen atoms in a molecule, and a platinum catalyst (see U.S. Patent Application Publication No. 2005/0006794 A1); a curable organopolysiloxane composition comprising: a linear organopolysiloxane having at least two alkenyl groups and at least one phenyl group in a molecule, a branched organopolysiloxane comprising $SiO_{4/2}$ units, $(CH_3)_3SiO_{1/2}$ units, and $(CH_3)(C_6H_5)(CH_2=CH)SiO_{1/2}$ units, an organopolysiloxane having at least two silicon atom-bonded hydrogen atoms in a molecule, and a platinum group metal-based catalyst (see U.S. Patent Application Publication Nos. 2007/0166470 A1 and 2008/0015326 A1).

However, cured products obtained by curing such curable organopolysiloxane compositions have poor mechanical properties, especially, insufficient retention of transparency and crack resistance under conditions of high temperature.

An object of the present invention is to provide a curable silicone composition that forms a cured product having good mechanical properties and good retention of transparency under conditions of high temperature. In addition, another object of the present invention is to provide a cured product having good mechanical properties and good retention of transparency under conditions of high temperature and to provide an optical semiconductor device having excellent reliability.

BRIEF SUMMARY

The present invention provides a curable silicone composition, comprising:

(A) 100 parts by mass of a linear organopolysiloxane having at least two alkenyl groups and at least one aryl group in a molecule;
(B) 10 to 60 parts by mass of a branched organopolysiloxane represented by the following average unit formula:

$$(R^1{}_3SiO_{1/2})_a(R^2{}_2SiO_{2/2})_b(SiO_{4/2})_c$$

wherein, $R^1$ are the same or different, and are alkyl groups having from 1 to 12 carbon atoms, or aryl groups having from 6 to 20 carbon atoms, with at least one R1 in a molecule being an aryl group; $R^2$ are the same or different, and are alkyl groups having from 1 to 12 carbon atoms, alkenyl groups having from 2 to 12 carbon atoms, or aryl groups having from 6 to 20 carbon atoms; and subscripts a, b, and c are numbers that satisfy the following conditions: $0.1<a\leq 0.6$, $0\leq b\leq 0.1$, $0.4\leq c<0.9$, and $a+b+c=1$;
(C) an organosiloxane having at least two silicon atom-bonded hydrogen atoms in a molecule, in an amount such that the number of silicon atom-bonded hydrogen atoms in this component is from 0.4 to 5 moles per 1 mole of total alkenyl groups in components (A) and (B); and
(D) an effective quantity of a hydrosilylation reaction catalyst.

In specific exemplified embodiments, component (A) is represented by the following general formula:

$$R^3{}_2R^4SiO(R^3{}_2SiO)_mSiR^3{}_2R^4$$

wherein, $R^3$ are the same or different, and are substituted or unsubstituted monovalent hydrocarbon groups free of aliphatic unsaturated bonds, with at least one $R^3$ in a molecule being an aryl group having from 6 to 12 carbon atoms; $R^4$ are the same or different, and are alkenyl groups having from 2 to 12 carbon atoms; and subscript m is a positive number.

In these or other specific exemplary embodiments, component (B) has a number average molecular weight (Mn) of at least 1500.

In these or other specific exemplary embodiments, component (C) comprises:
(C1) an organosiloxane represented by the following general formula:

$$HR^5{}_2SiO(R^5{}_2SiO)_nSiR^5{}_2H$$

wherein, $R^5$ are the same or different, and are alkyl groups having from 1 to 12 carbon atoms, or aryl groups having from 6 to 12 carbon atoms, with at least one $R^5$ in a molecule being an aryl group; and subscript n is a number from 1 to 100;
(C2) an organopolysiloxane having at least two silicon-bonded hydrogen atoms in a molecule and represented by the following average unit formula:

$$(HR^5{}_2SiO_{1/2})_d(R^5{}_2SiO_{2/2})_e(R^5SiO_{3/2})_f$$

wherein, each $R^5$ is independently selected and defined above, with at least one $R^5$ in a molecule being an aryl group; and subscripts d, e, and f are numbers that satisfy the following conditions: $0.1<d\leq 0.7$, $0\leq e\leq 0.5$, $0.1\leq f<0.9$, and $d+e+f=1$; or a mixture of components (C1) and (C2).

The present invention also provides a cured product. The cured product of the present invention is formed by curing the aforementioned curable silicone composition.

Further, the present invention provides an optical semiconductor device. The optical semiconductor device of the present invention comprises an optical semiconductor element sealed by a cured product of the curable silicone composition.

Effects of Invention

The curable silicone composition of the present invention is characterized by forming a cured product having good mechanical properties and good retention of transparency under conditions of high temperature. Furthermore, the cured product of the present invention is characterized by having good mechanical properties and good retention of transparency under conditions of high temperature, and the optical semiconductor device of the present invention is characterized by exhibiting excellent reliability.

BRIEF DESCRIPTION OF THE DRAWING(S)

Other advantages of the present invention will be readily appreciated, as the same becomes better understood by reference to the following detailed description when considered in connection with the accompanying drawing, wherein:

FIG. 1 is a cross-sectional view of an LED that is an example of an optical semiconductor device of the present invention.

DETAILED DESCRIPTION

First, the curable silicone composition of the present invention will be described in detail.

Component (A) is a linear organopolysiloxane having at least two alkenyl groups and at least one aryl group in a molecule. The at least two alkenyl groups and the at least one aryl group of component (A) are typically silicon-bonded groups. Examples of the alkenyl groups in component (A) include alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, and vinyl groups are typical. Examples of the aryl groups in component (A) include aryl groups having from 6 to 12 carbon atoms such as phenyl groups, tolyl groups, xylyl groups, and naphthyl groups, and phenyl groups are typical. Groups bonding to silicon atoms other than alkenyl groups and aryl groups in component (A) include alkyl groups having from 1 to 12 carbons, such as methyl groups, ethyl groups, propyl groups, butyl groups, pentyl groups, hexyl groups, heptyl groups, octyl groups, nonyl groups, decyl groups, undecyl groups, and dodecyl groups, and methyl groups are typical.

In specific embodiments, component (A) is represented by the following general formula:

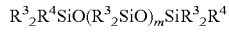

In the formula, $R^3$ are the same or different, and are substituted or unsubstituted monovalent hydrocarbon groups free of aliphatic unsaturated bonds. The hydrocarbon groups for $R^3$ are exemplified by the same groups other than alkenyl groups as those mentioned above, typically methyl groups and phenyl groups. However, at least one $R^3$ in a molecule is an aryl group, typically a phenyl group.

In the formula, $R^4$ are the same or different, and are alkenyl groups having from 2 to 12 carbon atoms. The alkenyl groups for $R^4$ are exemplified by the same alkenyl groups as those mentioned above, typically vinyl groups.

In the formula, subscript m is a positive number, optionally a positive number of from 1 to 1000, a positive number of from 1 to 500, or a positive number of from 1 to 100.

Examples of organopolysiloxanes for component (A) include copolymers of dimethylsiloxane and methylphenylsiloxane capped at both molecular terminals with dimethylvinylsiloxy groups, methylphenylpolysiloxanes capped at both molecular terminals with dimethylvinylsiloxy groups, copolymers of dimethylsiloxane, methylvinylsiloxane, and methylphenylsiloxane capped at both molecular terminals with trimethylsiloxy groups, dimethylpolysiloxanes capped at both molecular terminals with dimethylvinylsiloxy groups, copolymers of dimethylsiloxane and diphenylsiloxane capped at both molecular terminals with dimethylvinylsiloxy groups, dimethylpolysiloxanes capped at both molecular terminals with methylphenylvinylsiloxy groups, methylphenylpolysiloxanes capped at both molecular terminals with methylphenylvinylsiloxy groups, copolymers of dimethylsiloxane and methylvinylsiloxane capped at both molecular terminals with methylphenylvinylsiloxy groups, copolymers of dimethylsiloxane, methylvinylsiloxane, and methylphenylsiloxane capped at both molecular terminals with methylphenylvinylsiloxy groups, and mixtures of two or more of these organopolysiloxanes.

Component (B) is a branched organopolysiloxane represented by the following average unit formula:

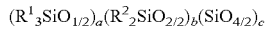

In the formula, $R^1$ are the same or different, and are alkyl groups having from 1 to 12 carbon atoms, or aryl groups having from 6 to 20 carbon atoms. Examples of the alkyl groups for $R^1$ include methyl groups, ethyl groups, propyl groups, butyl groups, pentyl groups, hexyl groups, heptyl groups, octyl groups, nonyl groups, decyl groups, undecyl groups, and dodecyl groups, and methyl groups are typical. In addition, examples of the aryl groups for $R^1$ include phenyl groups, tolyl groups, xylyl groups, and naphthyl groups, and phenyl groups are typical. However, at least one $R^1$ in a molecule is an aryl group, typically a phenyl group.

In the formula, $R^2$ are the same or different, and are alkyl groups having from 1 to 12 carbon atoms, alkenyl groups having from 2 to 12 carbon atoms, or aryl groups having from 6 to 20 carbon atoms. Examples of the alkyl groups for $R^2$ include the same alkyl groups described for $R^1$. Examples of the alkenyl groups for $R^2$ include vinyl groups, allyl groups, butenyl groups, pentenyl groups, hexenyl groups, heptenyl groups, octenyl groups, nonenyl groups, decenyl groups, undecenyl groups, and dodecenyl groups, and vinyl groups are most typical. In addition, examples of the aryl groups for $R^2$ include the same aryl groups described for $R^1$.

In the formula, subscripts a, b, and c are numbers that satisfy the following conditions: $0.1 \leq a \leq 0.6$, $0 \leq b \leq 0.1$, $0.4 \leq c \leq 0.9$, and $a+b+c=1$, alternatively numbers that satisfy the following conditions: $0.2 \leq a \leq 0.6$, $0 \leq b \leq 0.1$, $0.4 \leq c \leq 0.8$ and $a+b+c=1$, alternatively numbers that satisfy the following conditions: $0.25 \leq a \leq 0.6$, $0 \leq b \leq 0.05$, $0.4 \leq c \leq 0.75$, and $a+b+c=1$. This is because the transparency of the cured product is reduced if subscript a is not less than the lower limit of the above-mentioned range, and hardness of the cured product is good if subscript a is not more than the upper limit of the above-mentioned range. In addition, the mechanical properties of the cured product is good if subscript b is not more than the upper limit of the above-mentioned range. In addition, the mechanical characteristics of the cured product is improved if subscript c is not less than the lower limit of the above-mentioned range, and the refractive index of the cured product is good if subscript c is not more than the upper limit of the above-mentioned range.

While there are no particular limitations concerning the molecular weight of component (B), its number average molecular weight (Mn) based on standard polystyrene conversion gel permeation chromatography is in certain embodiments at least 1500, or at least 2000. This is due to the fact that the cured product has efficient reinforcement if the mass average molecular weight is not less than the lower limit of the above-mentioned range.

The content of component (B) is in a range of from 10 to 60 parts by mass, alternatively in a range of from 20 to 50, per 100 parts by mass of component (A). This is due to the fact that the strength of the resultant cured product increases when the content is not less than the lower limit of the above-mentioned range and, on the other hand, due to the fact that the handling properties (viscosity remains readily flowable) of the resultant composition increase when the content is not more than the upper limit of the above-mentioned range.

Component (C) is an organosiloxane having at least two silicon-bonded hydrogen atoms in a molecule. Organic groups in component (C) are exemplified by monovalent hydrocarbon groups free of aliphatic unsaturated bonds, such as methyl groups, ethyl groups, propyl groups, butyl groups, pentyl groups, hexyl groups, heptyl groups, and other alkyl groups having 1 to 12 carbon atoms; phenyl groups, tolyl groups, xylyl groups, naphthyl group, and other aryl groups having 6 to 12 carbon atoms, and methyl groups and phenyl groups are most typical. In addition, in view of the reduction in attenuation due to the refraction, reflection, and scattering of light by the resultant cured product, the content of aryl groups relative to all silicon atom-bonded organic groups in a molecule is typically not less than 10 mol %, and, alternatively, not less than 15 mol %.

The organosiloxane for component (C) is exemplified by methylphenylpolysiloxane having both terminals of the molecular chain end-blocked by dimethylhydrogensiloxy groups; methylphenylsiloxane-dimethylsiloxane copolymer having both terminals of the molecular chain end-blocked by dimethylhydrogensiloxy groups; methylphenylsiloxane-methylhydrogensiloxane copolymer having both terminals of the molecular chain end-blocked by trimethylsiloxy groups; methylphenylsiloxane-methylhydrogensiloxane-dimethylsiloxane copolymer having both terminals of the molecular chain end-blocked by trimethylsiloxy groups; organopolysiloxane copolymer made up of siloxane units represented by $(CH_3)_2HSiO_{1/2}$ and siloxane units represented by $C_6H_5SiO_{3/2}$; organopolysiloxane copolymer made up of siloxane units represented by $(CH_3)_2HSiO_{1/2}$, siloxane units represented by $(CH_3)_3SiO_{1/2}$, and siloxane units represented by $C_6H_5SiO_{3/2}$; organopolysiloxane copolymer made up of siloxane units represented by $(CH_3)_2HSiO_{1/2}$, siloxane units represented by $(CH_3)_2SiO_{2/2}$, and siloxane units represented by $C_6H_5SiO_{3/2}$; organopolysiloxane copolymer made up of siloxane units represented by $(CH_3)_2HSiO_{1/2}$, siloxane units represented by $C_6H_5(CH_3)_2SiO_{1/2}$, and siloxane units represented by $SiO_{4/2}$; organopolysiloxane copolymer made up of siloxane units represented by $(CH_3)HSiO_{2/2}$ and siloxane units represented by $C_6H_5SiO_{3/2}$; as well as mixtures of two or more of the above.

In particular, in view of the excellent flexibility of the resultant cured product, component (C) is in specific embodiments (C1) an organosiloxane represented by the following general formula:

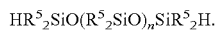

$HR^5{}_2SiO(R^5{}_2SiO)_n SiR^5{}_2H$.

In the formula, $R^5$ are the same or different, and are alkyl groups having from 1 to 12 carbon atoms, or aryl groups having from 6 to 12 carbon atoms. Examples of the alkyl groups for $R^5$ include the same alkyl groups described for $R^1$. In addition, examples of the aryl groups for $R^5$ include the same alkyl groups described for $R^1$. However, at least one $R^5$ in a molecule is an aryl group, typically a phenyl group.

In the formula, subscript n is a number of from 1 to 100, alternatively a number of from 1 to 50, alternatively a number of from 1 to 10. This is due to the fact that when subscript n in the above-mentioned range, the handling properties and filling properties of the resultant composition increase and the adherence of the resultant cured product tends to increase.

Examples of this type of component (C1) include organosiloxanes such as those mentioned below. Me and Ph in the formulae below denote a methyl group and a phenyl group, respectively, subscript n' is a number from 1 to 100, subscripts n" and n'" are each numbers of 1 or higher, and n"+n'" is a number of 100 or lower.

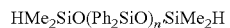

$HMe_2SiO(Ph_2SiO)_{n'}SiMe_2H$

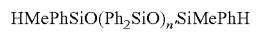

$HMePhSiO(Ph_2SiO)_{n'}SiMePhH$

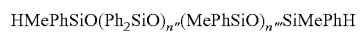

$HMePhSiO(Ph_2SiO)_{n''}(MePhSiO)_{n'''}SiMePhH$

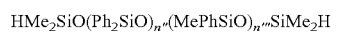

$HMe_2SiO(Ph_2SiO)_{n''}(MePhSiO)_{n'''}SiMe_2H$

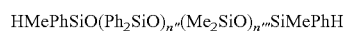

$HMePhSiO(Ph_2SiO)_{n''}(Me_2SiO)_{n'''}SiMePhH$

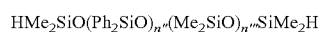

$HMe_2SiO(Ph_2SiO)_{n''}(Me_2SiO)_{n'''}SiMe_2H$

While, in view of the excellent mechanical properties of the resultant cured product, component (C) is in specific embodiments (C2) an organosiloxane represented by the following average unit formula:

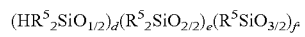

$(HR^5{}_2SiO_{1/2})_d(R^5{}_2SiO_{2/2})_e(R^5SiO_{3/2})_f$

In the formula, $R^5$ is independently selected and defined above. However, at least one $R^5$ in a molecule is an aryl group.

In the formula, subscripts d, e, and f are numbers that satisfy the following conditions: $0.1 < d \leq 0.7$, $0 \leq e \leq 0.5$, $0.1 \leq f < 0.9$, and $d+e+f=1$, alternatively numbers that satisfy the following conditions: $0.2 \leq d \leq 0.7$, $0 \leq e \leq 0.4$, $0.25 \leq f < 0.7$, and $d+e+f=1$. This is because the mechanical properties of the cured product is increased if subscript d is not less than the lower limit of the above-mentioned range, and the cured product has an appropriate hardness if subscript d is not more than the upper limit of the above-mentioned range. In addition, the cured product has an appropriate hardness and the reliability of an optical semiconductor device prepared using the present composition is improved if subscript e is not more than the upper limit of the above-mentioned range. In addition, the refractive index of the cured product is increased if subscript f is not less than the lower limit of the above-mentioned range, and the mechanical strength of the cured product is improved if subscript f is not more than the upper limit of the above-mentioned range.

Examples of this type of component (C2) include organopolysiloxanes such as those mentioned below. Moreover, Me and Ph in the formulae below denote a methyl group and a phenyl group, respectively, and subscripts d, d', e', and f are numbers that satisfy the following conditions: $0.1 \leq d \leq 0.7$, $0.1 \leq d' \leq 0.7$, $0 < e' \leq 0.5$, $0.1 \leq f < 0.9$, and $d+d'+e'+f=1$.

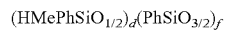

$(HMePhSiO_{1/2})_d(PhSiO_{3/2})_f$

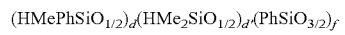

$(HMePhSiO_{1/2})_d(HMe_2SiO_{1/2})_{d'}(PhSiO_{3/2})_f$

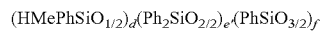

$(HMePhSiO_{1/2})_d(Ph_2SiO_{2/2})_{e'}(PhSiO_{3/2})_f$

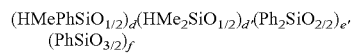

$(HMePhSiO_{1/2})_d(HMe_2SiO_{1/2})_{d'}(Ph_2SiO_{2/2})_{e'}(PhSiO_{3/2})_f$

Component (C) can be the above-mentioned component (C1), the above-mentioned component (C2), or a mixture of the above-mentioned component (C1) and the above-mentioned component (C2). In cases where a mixture of the above-mentioned component (C1) and the above-mentioned component (C2) is used, the mixing ratio is not particularly limited, but it is typical for the ratio of mass of the above-mentioned component (C1): mass of the above-mentioned component (C2) to be from 0.5:9.5 to 9.5:0.5.

The content of component (C) in the present composition, per 1 mole of total alkenyl groups in components (A) and (B), is in a range such that the silicon-bonded hydrogen atoms in component (C) is in a range from 0.1 to 5 moles, alternatively in a range from 0.5 to 2 moles. This is because the composition can be satisfactorily cured if the content of component (C) is not less than the lower limit of the above-mentioned range and the heat resistance of the cured product is improved and the reliability of an optical semiconductor device prepared using the present composition is improved if the content of component (C) is not more than the upper limit of the above-mentioned range.

Component (D) is a hydrosilylation reaction catalyst used to facilitate curing of the present composition, and examples of component (D) include platinum-based catalysts, rhodium-based catalysts, and palladium-based catalysts. Component (D) is typically a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being most typical.

The content of component (D) in the present composition is an effective quantity for facilitating curing of the present composition. Specifically, in order to satisfactorily cure the present composition, the content of component (D) is typically a quantity whereby the content of catalytic metal in component (D) relative to the present composition is from 0.01 to 500 ppm, alternatively from 0.01 to 100 ppm, alternatively from 0.01 to 50 ppm, in terms of mass units.

In order to improve adhesion of the cured product to a base material being contacted during curing, the present composition may contain an adhesion-imparting agent. In certain embodiments, the adhesion-imparting agents are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and the methoxy group is most typical. Moreover, non-alkoxy groups bonded to a silicon atom of this organosilicon compound are exemplified by substituted or non-substituted monovalent hydrocarbon groups such as alkyl groups, alkenyl groups, aryl groups, aralkyl groups, halogenated alkyl groups and the like; epoxy group-containing monovalent organic groups such as a 3-glycidoxypropyl group, a 4-glycidoxybutyl group, or similar glycidoxyalkyl groups; a 2-(3,4-epoxycyclohexyl)ethyl group, a 3-(3,4-epoxycyclohexyl)propyl group, or similar epoxycyclohexylalkyl groups; and a 4-oxiranylbutyl group, an 8-oxiranyloctyl group, or similar oxiranylalkyl groups; acrylic group-containing monovalent organic groups such as a 3-methacryloxypropyl group and the like; and a hydrogen atom. This organosilicon compound generally has a silicon-bonded alkenyl group or silicon-bonded hydrogen atom. Moreover, due to the ability to impart good adhesion with respect to various types of base materials, this organosilicon compound generally has at least one epoxy group-containing monovalent organic group in a molecule. This type of organosilicon compound is exemplified by organosilane compounds, organosiloxane oligomers and alkyl silicates. Molecular structure of the organosiloxane oligomer or alkyl silicate is exemplified by a linear chain structure, partially branched linear chain structure, branched chain structure, ring-shaped structure, and net-shaped structure. A linear chain structure, branched chain structure, and net-shaped structure are typical. This type of organosilicon compound is exemplified by silane compounds such as 3-glycidoxypropyltrimethoxysilane, 2-(3,4-epoxycyclohexyl)ethyltrimethoxysilane, 3-methacryloxy propyltrimethoxysilane, and the like; siloxane compounds having at least one silicon-bonded alkenyl group or silicon-bonded hydrogen atom, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in the molecule; and methyl polysilicate, ethyl polysilicate, and epoxy group-containing ethyl polysilicate. In the present composition, the content of the adhesion-imparting agents is not particularly limited, but in order to achieve good adhesion to a base material being contacted during curing, the content of the adhesion-imparting agents is in certain embodiments from 0.01 to 10 parts by mass per 100 parts total mass of components (A) to (D).

A reaction inhibitor, for example, an alkyne alcohol such as 2-methyl-3-butyn-2-ol, 3,5-dimethyl-1-hexyn-3-ol, or 2-phenyl-3-butyn-2-ol; an ene-yne compound such as 3-methyl-3-penten-1-yne or 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane, or a benzotriazole may be incorporated as an optional component in the present composition. The content of the reaction inhibitor in the present composition is not particularly limited, but if included is typically from 0.0001 to 5 parts by mass per 100 parts total mass of the above-mentioned components (A) to (D).

Moreover, the present composition may include as an additional optional component a phosphor. This phosphor is exemplified by substances widely used in light emitting diodes (LED), such as yellow, red, green, and blue light-emitting phosphors such as oxide type phosphors, oxynitride type phosphors, nitride type phosphors, sulfide type phosphors, oxysulfide type phosphors, and the like. Examples of oxide type phosphors include yttrium, aluminum, and garnet-type YAG green to yellow light-emitting phosphors containing cerium ions; terbium, aluminum, and garnet-type TAG yellow light-emitting phosphors containing cerium ions; and silicate green to yellow light-emitting phosphors containing cerium or europium ions. Examples of oxynitride type phosphors include silicon, aluminum, oxygen, and nitrogen-type SiAlON red to green light-emitting phosphors containing europium ions. Examples of nitride type phosphors include calcium, strontium, aluminum, silicon, and nitrogen-type CASN red light-emitting phosphors containing europium ions. Examples of sulfide type phosphors include ZnS green light-emitting phosphors containing copper ions or aluminum ions. Examples of oxysulfide type phosphors include $Y_2O_2S$ red light-emitting phosphors containing europium ions. These phosphors may be used as one type or as a mixture of two or more types. The content of this phosphor in the present composition is not particularly limited, but is typically from 0.1 to 70% by mass, alternatively from 1 to 20% by mass, relative to the present composition.

An inorganic filler such as silica, glass, alumina, or zinc oxide; an organic resin fine powder of a polymethacrylate resin and the like; a heat-resistant agent, a dye, a pigment, a flame retardant, a solvent, and the like may be incorporated as optional components in the present composition at levels that do not impair the objective of the present invention.

The present composition is such that curing occurs either at room temperature or under heating, but it is most typical to heat the composition in order to achieve rapid curing. The heating temperature is generally from 50 to 200° C.

The cured product of the present invention will now be described in detail.

The cured product of the present invention is formed by curing the aforementioned curable silicone composition. The form of the cured product is not particularly limited, and can be in the form of, for example, a sheet or film. The cured product can be handled alone but can also be handled in a state whereby the cured product covers or seals an optical semiconductor element.

The optical semiconductor device of the present invention will now be described in detail.

The optical semiconductor device of the present invention is characterized in that an optical semiconductor element is sealed by a cured product of the above-mentioned curable silicone composition. Examples of the optical semiconductor device of the present invention include light emitting diodes (LEDs), photocouplers, and CCDs. In addition, examples of optical semiconductor elements include light emitting diode (LED) chips and solid-state image sensing devices.

FIG. 1 is a cross-sectional drawing of a single surface mounted type LED, which is an example of the optical semiconductor device of the present invention. In the LED illustrated in FIG. 1, an LED chip 1 is die-bonded to a lead frame 2, and the LED chip 1 and a lead frame 3 are wire-bonded by a bonding wire 4. A frame material 5 is provided around the periphery of this LED chip 1, and the LED chip 1 on the inner side of this frame material 5 is sealed by a cured product 6 of the curable silicone composition of the present invention.

An example of a method for producing the surface mounted type LED illustrated in FIG. 1 is a method comprising die-bonding the LED chip 1 to the lead frame 2, wire-bonding this LED chip 1 and the lead frame 3 by means of metal bonding wire 4, filling inside the frame material 5 provided around the LED chip 1 with the curable silicone composition of the present invention, and then curing the curable silicone composition by heating to 50 to 200° C.

EXAMPLES

The curable silicone composition, a cured product thereof and an optical semiconductor device of the present invention will now be described using examples. In the examples, Me, Vi, and Ph denote a methyl group, a vinyl group, and a phenyl group, respectively. Moreover, the physical property values are values measured at 25° C., and the properties of the cured product were measured as follows.

[Refractive Index of Cured Product]

A cured product is produced by heating the curable silicone composition at 150° C. for 2 hours in a circulating hot air oven. The refractive index of this cured product at 25° C. and a wavelength of 633 nm was measured using a refractometer.

[Mechanical Properties of Cured Product]

A cured product having a thickness of 0.5 mm was prepared by heating the curable silicone composition for 1 hour at 150° C. The tensile strength (MPa) and elongation (%) of the cured product was measured in accordance with JIS K 6251.

[Decrease of Transmittance of Cured Product]

A cured product having a light path length of 2.0 mm was prepared by heating the curable silicone composition for 1 hour at 150° C. The light transmittance of the cured product was measured at a wavelength of 450 nm.

The cured product was then exposed for 500 hours at a temperature of 200° C., or for 250 hours at a temperature of 250° C. The light transmittance of the cured product after heat treatment was measured in the same way as described above. Decrease of transmittance of the cured product was calculated based on the following equation.

Decrease of transmittance=$((X-Y)/X) \times 100$     [Equation 1]

X: Initial transmittance of the cured product
Y: Transmittance of the cured product after heat treatment Practical Example 1

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 4,200 based on standard polystyrene conversion gel permeation chromatography and represented by the following average unit formula:

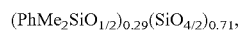
$(PhMe_2SiO_{1/2})_{0.29}(SiO_{4/2})_{0.71}$, 7.2 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

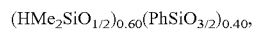
$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 5,800 mPa·s. The physical property values of a cured product of this curable silicone composition were evaluated. These results are shown in Table 1.

Practical Example 2

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 2,300 based on standard polystyrene conversion gel permeation chromatography and represented by the following average unit formula:

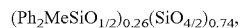
$(Ph_2MeSiO_{1/2})_{0.26}(SiO_{4/2})_{0.74}$, 7.2 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 31,000 mPa·s. The physical property values of a cured product of this curable silicone composition were evaluated. These results are shown in Table 1.

Practical Example 3

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 3,600 based on standard polystyrene conversion gel permeation chromatography and represented by the following average unit formula:

$(PhMe_2SiO_{1/2})_{0.28}(MeViSiO_{2/2})_{0.02}(SiO_{4/2})_{0.70}$, 8.3 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 7,500 mPa·s. The physical property values of a cured product of this curable silicone composition were evaluated. These results are shown in Table 1.

Practical Example 4

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 6,100 based on standard polystyrene conversion gel permeation chromatography and represented by the following average unit formula:

$(Ph_2MeSiO_{1/2})_{0.28}(MeViSiO_{2/2})_{0.02}(SiO_{4/2})_{0.70}$, 7.4 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 750,000 mPa·s. The physical property values of a cured product of this curable silicone composition were evaluated. These results are shown in Table 1.

Comparative Example 1

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 5,100 based on standard polystyrene conversion gel permeation chromatography and represented by the following average unit formula:

$(PhMe_2SiO_{1/2})_{0.28}(Me_2ViSiO_{1/2})_{0.01}(SiO_{4/2})_{0.71}$, 7.8 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 13,000 mPa·s. The physical property values of a cured product of this curable silicone composition were evaluated. These results are shown in Table 1.

Comparative Example 2

70.0 parts by mass of an organopolysiloxane represented by the following formula:

$ViMe_2SiO(PhMeSiO)_{25}SiMe_2Vi$, 30.0 parts by mass of an organopolysiloxane having a number average molecular weight (Mn) of 1,300 based on standard polystyrene conversion gel permeation chromatography and represented by the following average unit formula:

$(Me_2ViSiO_{1/2})_{0.25}(PhSiO_{3/2})_{0.75}$, 13.6 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$(HMe_2SiO_{1/2})_{0.60}(PhSiO_{3/2})_{0.40}$, and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 3,300 mPa·s. The physical property values of a cured product of this curable silicone composition were evaluated. These results are shown in Table 1.

Comparative Example 3

100.0 parts by mass of an organopolysiloxane represented by the following formula:

$ViMe_2SiO(PhMeSiO)_{25}SiMe_2Vi$, 10.3 parts by mass (at an amount where the number of silicon-bonded hydrogen atoms in the present component is 1.0 mole relative to 1 mole of vinyl groups in the above-mentioned organopolysiloxane) of the organopolysiloxane represented by the following average unit formula:

$$(HMe_2SiO_{1/2})_{0.60}(PhSiO_{3/2})_{0.40},$$

and 0.25 parts by mass of a solution of a platinum-1,3-divinyl-1,1,3,3-tetramethyldisiloxane complex in 1,3-divinyl-1,1,3,3-tetramethyldisiloxane (the solution containing 0.1% by mass of platinum) were mixed, thereby producing a curable silicone composition having a viscosity of 1,400 mPa·s. The physical property values of a cured product of this curable silicone composition were evaluated. These results are shown in Table 1.

TABLE 1

| Item | Practical Examples | | | | Comparative Examples | | |
|---|---|---|---|---|---|---|---|
| | 1 | 2 | 3 | 4 | 1 | 2 | 3 |
| Refractive index | 1.53 | 1.54 | 1.53 | 1.54 | 1.51 | 1.54 | 1.54 |
| Tensile strength (MPa) | 1.21 | 1.67 | 1.21 | 1.56 | 0.68 | 1.21 | 0.43 |
| Elongation (%) | 71.6 | 83.0 | 71.0 | 66.7 | 45.1 | 33.0 | 23.0 |
| Decrease of transmittance after 500 hrs. at 200° C. (%) | −2.4 | −0.7 | −1.9 | −0.1 | −3.0 | −9.1 | −11.2 |
| Decrease of transmittance after 250 hrs. at 250° C. (%) | −4.6 | −3.4 | −6.0 | −2.7 | −10.4 | −20.1 | −20.4 |

INDUSTRIAL APPLICABILITY

The curable silicone composition of the present invention can be used as an electrical or electronic adhesive agent, bonding agent, protective agent, coating agent, or underfill agent, has high reactivity, and can form a cured product having good mechanical properties and good retention of transparency under conditions of high temperature, and is therefore suitable for use as a sealing agent or protective coating material for an optical semiconductor element in an optical semiconductor device such as a light emitting diode (LED).

DESCRIPTION OF SYMBOLS

1 Optical semiconductor element
2 Lead frame
3 Lead frame
4 Bonding wire
5 Frame material
6 Cured product of curable silicone composition

What is claimed is:

1. A curable silicone composition comprising:
(A) 100 parts by mass of a linear organopolysiloxane having at least two alkenyl groups and at least one aryl group in a molecule;
(B) 10 to 60 parts by mass of a branched organopolysiloxane represented by the following average unit formula:

$$(R^1{}_3S_{1/2})_a(R^2{}_2SiO_{2/2})_b(SiO_{4/2})_c$$

wherein, $R^1$ are the same or different, and are alkyl groups having from 1 to 12 carbon atoms, or aryl groups having from 6 to 20 carbon atoms, with at least one $R^1$ in a molecule being an aryl group; $R^2$ are the same or different, and are alkyl groups having from 1 to 12 carbon atoms, alkenyl groups having from 2 to 12 carbon atoms, or aryl groups having from 6 to 20 carbon atoms; and subscripts a, b, and c are numbers that satisfy the following conditions: $0.1 \leq a \leq 0.6$, $0 \leq b \leq 0.1$, $0.4 \leq c \leq 0.9$, and $a+b+c=1$;
(C) an organosiloxane having at least two silicon atom-bonded hydrogen atoms in a molecule, in an amount such that the number of silicon atom-bonded hydrogen atoms in this component is from 0.4 to 5 moles per 1 mole of total alkenyl groups in components (A) and (B), wherein the organosiloxane is:
(C1) an organosiloxane represented by the following general formula:

$$HR^5{}_2SiO(R^5{}_2SiO)_nSiR^5{}_2H$$

wherein, $R^5$ are the same or different, and are alkyl groups having from 1 to 12 carbon atoms, or aryl groups having from 6 to 12 carbon atoms, with at least one $R^5$ in a molecule being an aryl group; and subscript n is a number from 1 to 100;
(C2) an organopolysiloxane having at least two silicon-bonded hydrogen atoms in a molecule and represented by the following average unit formula:

$$(HR^5{}_2SiO_{1/2})_d(R^5{}_2SiO_{2/2})_e(R^5SiO_{3/2})_f$$

wherein, each $R^5$ is independently selected and defined above, with at least one $R^5$ in a molecule being an aryl group; and subscripts d, e, and f are numbers that satisfy the following conditions: $0.1 < d \leq 0.7$, $0 \leq e \leq 0.5$, $0.1 \leq f < 0.9$, and $d+e+f=1$; or
a mixture of components (C1) and (C2); and
(D) an effective quantity of a hydrosilylation reaction catalyst.

2. The curable silicone composition according to claim 1, wherein component (A) is represented by the following general formula:

$$R^3{}_2R^4SiO(R^3{}_2SiO)_mSiR^3{}_2R^4$$

wherein, $R^3$ are the same or different, and are substituted or unsubstituted monovalent hydrocarbon groups free of aliphatic unsaturated bonds, with at least one $R^3$ in a molecule being an aryl group having from 6 to 12 carbon atoms; $R^4$ are the same or different, and are alkenyl groups having from 2 to 12 carbon atoms; and subscript m is a positive number.

3. The curable silicone composition according to claim 1, wherein component (B) has a number average molecular weight (Mn) of at least 1500.

4. A method of preparing a cured product, said method comprising:
providing a curable silicone composition; and
curing the curable silicone composition to give the cured product;
wherein the curable silicone composition is the curable silicone composition according to claim 1.

5. A cured product obtained by curing the curable silicone composition according to claim 1.

6. An optical semiconductor device comprising an optical semiconductor element sealed by a cured product of the curable silicone composition according to claim 1.

7. An optical semiconductor device comprising:
an optical semiconductor element; and
a cured product sealing the optical semiconductor element, the cured product being the cured product of claim 5.

* * * * *